(12) United States Patent
Cho (10) Patent No.: US 8,050,094 B2
(45) Date of Patent: Nov. 1, 2011

(54) MEMORY CELL ARRAY AND NON-VOLATILE MEMORY DEVICE

(75) Inventor: Ji-Ho Cho, Suwon-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 728 days.

(21) Appl. No.: 12/198,186

(22) Filed: Aug. 26, 2008

(65) Prior Publication Data

US 2009/0059666 A1    Mar. 5, 2009

(30) Foreign Application Priority Data

Aug. 30, 2007  (KR) .................. 10-2007-0087576

(51) Int. Cl.
*G11C 11/34* (2006.01)
(52) U.S. Cl. ......... 365/185.11; 365/230.03; 365/185.21; 365/196
(58) Field of Classification Search ............. 365/185.11, 365/230.03, 185.21, 196
See application file for complete search history.

(56) References Cited

U.S. PATENT DOCUMENTS

| 5,768,174 | A  | * | 6/1998 | Seo et al. ............. 365/63 |
| 6,587,374 | B2 |   | 7/2003 | Takagi et al. |
| 6,850,446 | B1 |   | 2/2005 | Raszka et al. |
| 7,009,880 | B1 |   | 3/2006 | Liu |

FOREIGN PATENT DOCUMENTS

JP    2000-207892    7/2000

* cited by examiner

*Primary Examiner* — Jason Lappas
(74) *Attorney, Agent, or Firm* — Volentine & Whitt, PLLC (57) ABSTRACT

A memory cell array, divided into multiple row memory cell arrays, includes multiple memory banks and sense amplifiers. Each of the memory banks includes multiple logical sectors and at least two sub-memory banks of multiple sub-memory banks. The at least two sub-memory banks are included in different row memory cell arrays, and each of the sub-memory banks includes multiple physical sectors. The sense amplifiers are dedicated to the sub-memory banks, respectively.

20 Claims, 8 Drawing Sheets

MEMORY CELL ARRAY AND NON-VOLATILE MEMORY DEVICE

PRIORITY STATEMENT

A claim of priority is made to Korean Patent Application No. 10-2007-0087576, filed on Aug. 30, 2007, in the Korean Intellectual Property Office, the subject matter of which is hereby incorporated by reference.

BACKGROUND

1. Field

Various embodiments relate to a memory cell array and a nonvolatile memory device, and more particularly, to a memory cell array having a sense amplifier per sub-memory bank, and a nonvolatile memory device including the memory cell array.

2. Description of the Related Art

Semiconductor memory devices may be generally divided into volatile memory devices and non-volatile memory devices. The volatile memory devices store data by utilizing logic states of bi-stable flip-flops, or by charging or discharging capacitors. The volatile memory devices lose stored data when power is turned off.

The non-volatile memory devices, such as flash memory devices, retain stored data over time, even when power is turned off. The non-volatile memory devices are used to store data or programs in a wide range of applications and devices, such as computers, mobile communication devices, etc. Since flash memory devices, in particular, are capable of electrically erasing/writing data, flash memory devices are widely used in applications requiring continuous updates. For example, flash memory devices may be used as storage devices storing system programs.

Figure 1:
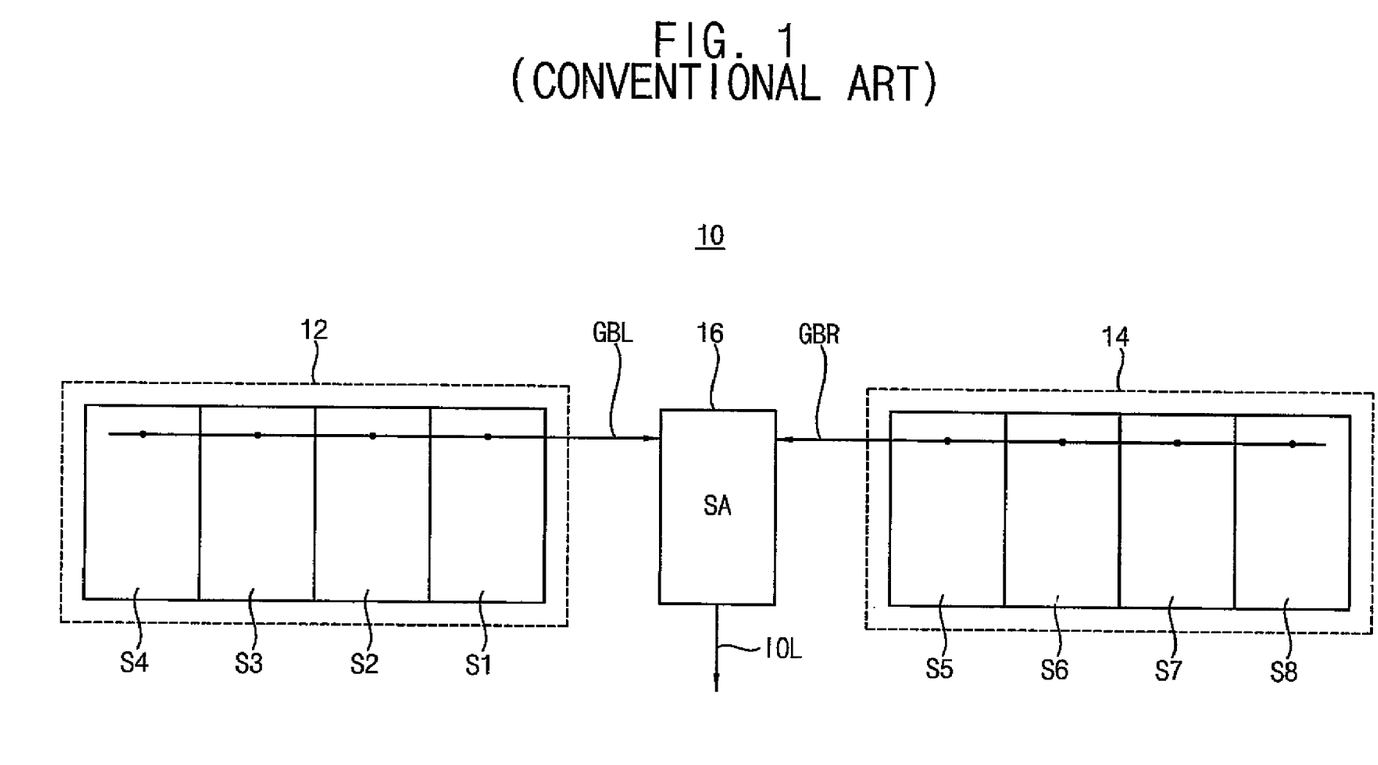
FIG. 1 is a block diagram illustrating a portion of a memory cell array included in a conventional flash memory device.

FIG. 1 is a block diagram illustrating a portion of a memory cell array 10 included in a conventional flash memory device. Generally, a memory cell array may include multiple sub-memory banks. In FIG. 1, the memory cell array 10 is illustrated as having two sub-memory banks for the sake of description.

Referring to FIG. 1, the memory cell array 10 includes a first sub-memory bank 12, a second sub-memory bank 14 and a sense amplifier 16. The first sub-memory bank 12 and the second sub-memory bank 14 constitute one memory bank.

The first sub-memory bank 12 includes first sectors S1, S2, S3 and S4, and the second sub-memory bank 14 includes second sectors S5, S6, S7 and S8. The first sectors S1, S2, S3 and S4 are coupled to the sense amplifier 16 through a first global bit line GBL, and the second sectors S5, S6, S7 and S8 are coupled to the sense amplifier 16 through a second global bit line GBR. The sense amplifier 16 senses and amplifies signals output from the first and second sectors S1, S2, S3, S4, S5, S6, S7 and S8, and provides the amplified signal through an input/output line IOL.

In the conventional memory cell array 10, the sense amplifier 16 may not be located in the middle of the first sub-memory bank 12 and the second sub-memory bank 14, but rather may be located off to one side, due to the existence of circuit blocks, such as a bank driver. Therefore, a coupling characteristic of the conventional memory cell array 10 may be deteriorated since an output signal of the first sub-memory bank 12 and an output signal of the second sub-memory bank 14 are amplified by the same sense amplifier 16 and output through the same input/output line IOL.

To improve the coupling characteristic, a conventional memory cell array may have the same number of sense amplifiers as sub-memory banks, so that the sub-memory banks constituting one memory bank do not share the input/output line IOL. Thus, the sub-memory banks constituting one memory bank are accessed by separate input/output lines and separate sense amplifiers, thereby improving the coupling characteristic. However, in order for a flash memory device to have the same number of sense amplifiers as sub-memory banks, the conventional flash memory device must have a large circuit size. Moreover, in the conventional flash memory device, power noise is increased.

SUMMARY

According to various exemplary embodiments, a memory cell array, divided into multiple row memory cell arrays, includes multiple memory banks and sense amplifiers. Each of the memory banks includes multiple logical sectors and at least two sub-memory banks of multiple sub-memory banks. The at least two sub-memory banks are included in different row memory cell arrays, and each of the sub-memory banks includes multiple physical sectors. The sense amplifiers are dedicated to the sub-memory banks, respectively.

The memory cell array may further include multiple write buffers corresponding to the memory banks. Data to be written to each of the memory banks may be buffered by the corresponding write buffer.

Each of the logical sectors may be a unit of an erase operation or a read operation. Also, a number of the at least two sub-memory banks included in each of the memory banks may be a quotient obtained by dividing a number of the physical sectors included in the each of the memory banks by a number of logical sectors included in the each of the memory banks.

At least two physical sectors respectively included in the at least two sub-memory banks may be substantially simultaneously accessed during a read operation. The at least two physical sectors substantially simultaneously accessed may be included in the same logical sector of the logical sectors.

The memory cell array may further include power lines configured to provide a power supply voltage to the sub-memory banks, the power lines being physically separated from each other. Also, the memory cell array may further include first power lines configured to provide a high power supply voltage to the sub-memory banks, the first power first lines being physically separated from each other, and second power lines configured to provide a low power supply voltage to the sub-memory banks, the second power lines being physically separated from each other.

Each of the logical sectors may include two physical sectors of the multiple physical sectors. Each of the memory banks may include two sub-memory banks.

In addition, each of the memory banks may further include first and second sub-memory banks of the multiple sub-memory banks, and first and second sense amplifiers of the multiple sense amplifiers. The first sub-memory bank may include lower part physical sectors, each of the lower part physical sectors being one of the two physical sectors of each logical sector. The first sense amplifier may be configured to amplify an output signal of the first sub-memory bank and to output the amplified output signal through a first input/output line. The second sub-memory bank may include upper part physical sectors, each of the upper part physical sectors being the other of the two physical sectors of each logical sector. The second sense amplifier may be configured to amplify an output signal of the second sub-memory bank and to output the amplified output signal through a second input/output line. A first lower part physical sector of the lower part physical sectors included in the first sub-memory bank and a first upper part physical sector of the upper part physical sectors included in the second sub-memory bank may be substantially simultaneously accessed during a read operation.

The memory cell array may further include a first power line configured to provide a power supply voltage to the lower part physical sectors included in the first sub-memory bank, and a second power line configured to provide the power supply voltage to the upper part physical sectors included in the second sub-memory bank. The second power line is physically separated from the first power line.

Also, the memory cell array may further include a first power line configured to provide a high power supply voltage to the lower part physical sectors included in the first sub-memory bank, a second power line configured to provide the high power supply voltage to the upper part physical sectors included in the second sub-memory bank, a third power line configured to provide a low power supply voltage to the lower part physical sectors included in the first sub-memory bank, and a fourth power line configured to provide the low power supply voltage to the upper part physical sectors included in the second sub-memory bank. The second power line is physically separated from the first power line, and the fourth power line is physically separated from the third power line.

According to various exemplary embodiments, a non-volatile memory device includes a voltage generating circuit, a row decoder, a column decoder and a memory cell array. The voltage generator is configured to generate a program voltage or an erase voltage based on a program control signal or an erase control signal, respectively. The row decoder is configured to generate a word line drive signal based on a bank address and at least one of the program voltage and the erase voltage. The column decoder is configured to generate a column select signal by decoding the bank address. The memory cell array is configured to operate in response to the word line drive signal and the column select signal. The memory cell array is divided into multiple row memory cell arrays, and includes multiple memory banks and sense amplifiers. Each of the memory banks includes multiple logical sectors and at least two sub-memory banks of multiple sub-memory banks. The at least two sub-memory banks are included in different row memory cell arrays of the multiple row memory cell arrays, and each of the sub-memory banks includes multiple physical sectors. The sense amplifiers are dedicated to the sub-memory banks, respectively.

Data to be written to each memory bank may be buffered by different write buffers of multiple write buffers.

At least two physical sectors respectively included in the at least two sub-memory banks may be substantially simultaneously accessed during a read operation. The at least two physical sectors substantially simultaneously accessed may be included in the same logical sector of the multiple logical sectors.

The memory cell array may further include power lines configured to provide a power supply voltage to the plurality of sub-memory banks. The power lines are physically separated from each other. Also, each of the logical sectors may include two physical sectors of the multiple physical sectors.

According to various exemplary embodiments, in a method of providing a memory cell array, each logical sector of multiple logical sectors included in a memory bank are divided into at least two physical sectors. Each sub-memory bank of multiple sub-memory banks is constituted based on physical sectors, which are selected from different logical sectors. The memory bank is constituted based on a combination of the sub-memory banks in different rows. Dedicated sense amplifiers are assigned to the sub-memory banks, respectively.

Data to be written to the sub-memory banks of the memory bank may be buffered by different write buffers. Also, each of the logical sectors may be a unit of an erase operation or a read operation.

The physical sectors respectively included in the sub-memory banks may be substantially simultaneously accessed during a read operation. The physical sectors simultaneously accessed may be included in the same logical sector of the logical sectors.

A power supply voltage may provided to the physical sectors through different power lines.

Accordingly, the various embodiments of the memory cell array, as well as methods of providing a memory cell array, may reduce power noise and improve a coupling characteristics, as well as efficiently utilize write buffers, for example.

DETAILED DESCRIPTION OF THE EMBODIMENTS

Various embodiments of the present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

It will be understood that, although the terms first, second, etc., may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
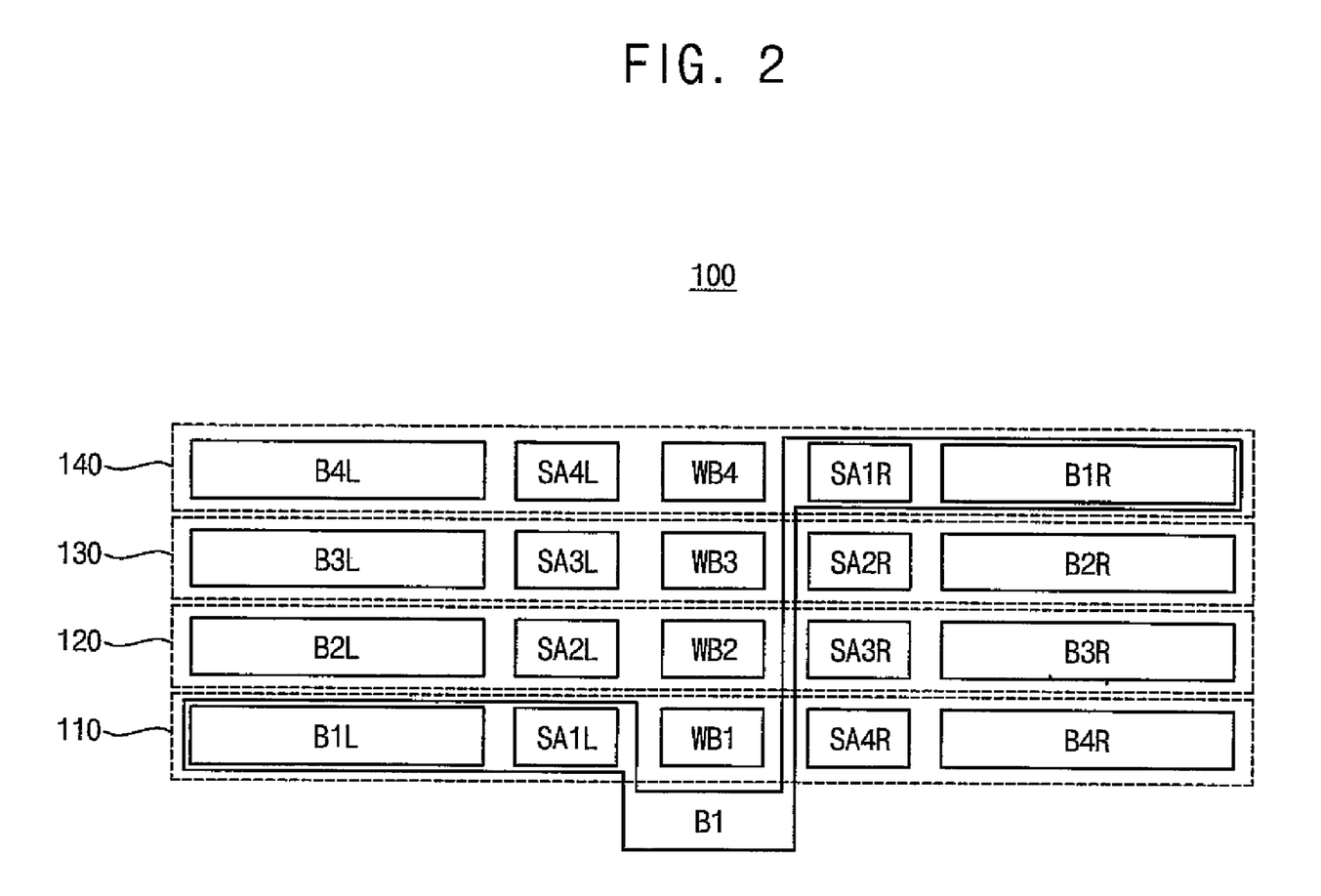
FIG. 2 is a block diagram illustrating a memory cell array, according to illustrative embodiments.

FIG. 2 is a block diagram illustrating a memory cell array, according to examplary embodiments of the present invention.

Referring to FIG. 2, the memory cell array 100 includes a first row memory cell array 110, a second row memory cell array 120, a third row memory cell array 130 and a fourth row memory cell array 140. The first row memory cell array 110 includes a first sub-memory bank B1L, a first sense amplifier SA1L, a second sub-memory bank B4R, a second sense amplifier SA4R and a first write buffer WB1. The second row memory cell array 120 includes a third sub-memory bank B2L, a third sense amplifier SA2L, a fourth sub-memory bank B3R, a fourth sense amplifier SA3R and a second write buffer WB2. The third row memory cell array 130 includes a fifth sub-memory bank B3L, a fifth sense amplifier SA3L, a sixth sub-memory bank B2R, a sixth sense amplifier SA2R and a third write buffer WB3. The fourth row memory cell array 140 includes a seventh sub-memory bank B4L, a seventh sense amplifier SA4L, a eighth sub-memory bank B1R, a eighth sense amplifier SA1R and a fourth write buffer WB4.

In the memory cell array 100 of FIG. 2, each memory bank is comprised of sub-memory banks, each of which is included in the different row memory cell arrays.

For example, a first memory bank B1 may include the first sub-memory bank B1L included in the first row memory cell array 110, the first sense amplifier SA1L included in the first row memory cell array 110, the eighth sub-memory bank B1R included in the fourth row memory cell array 140, and the eighth sense amplifier SA1R included in the fourth row memory cell array 140. Similarly, a second memory bank may include the third sub-memory bank B2L, the third sense amplifier SA2L, the sixth sub-memory bank B2R, and the sixth sense amplifier SA2R. A third memory bank may include the fifth sub-memory bank B3L, the fifth sense amplifier SA3L, the fourth sub-memory bank B3R, and the fourth sense amplifier SA3R. A fourth memory bank may include the seventh sub-memory bank B4L, the seventh sense amplifier SA4L, the second sub-memory bank B4R, and the second sense amplifier SA4R.

While the memory cell array 100 illustrated in FIG. 2 includes four memory banks, it is understood that this is for discussion purposes, and the memory cell array 100 may include any number of memory banks.

The first sense amplifier SA1L is dedicated to the first sub-memory bank B1L, the second sense amplifier SA4R is dedicated to the second sub-memory bank B4R, the third sense amplifier SA2L is dedicated to the third sub-memory bank B2L, the fourth sense amplifier SA3R is dedicated to the fourth sub-memory bank B3R, the fifth sense amplifier SA3L is dedicated to the fifth sub-memory bank B3L, the sixth sense amplifier SA2R is dedicated to the sixth sub-memory bank B2R, the seventh sense amplifier SA4L is dedicated to the seventh sub-memory bank B4L, and the eighth sense amplifier SA1R is dedicated to the eighth sub-memory bank B1R.

As described more fully below, each of the sub-memory banks B1L, B1R, B2L, B2R, B3L, B3R, B4L and B4R has multiple logical sectors. Each of the logical sectors includes two or more physical sectors.

Figure 3:
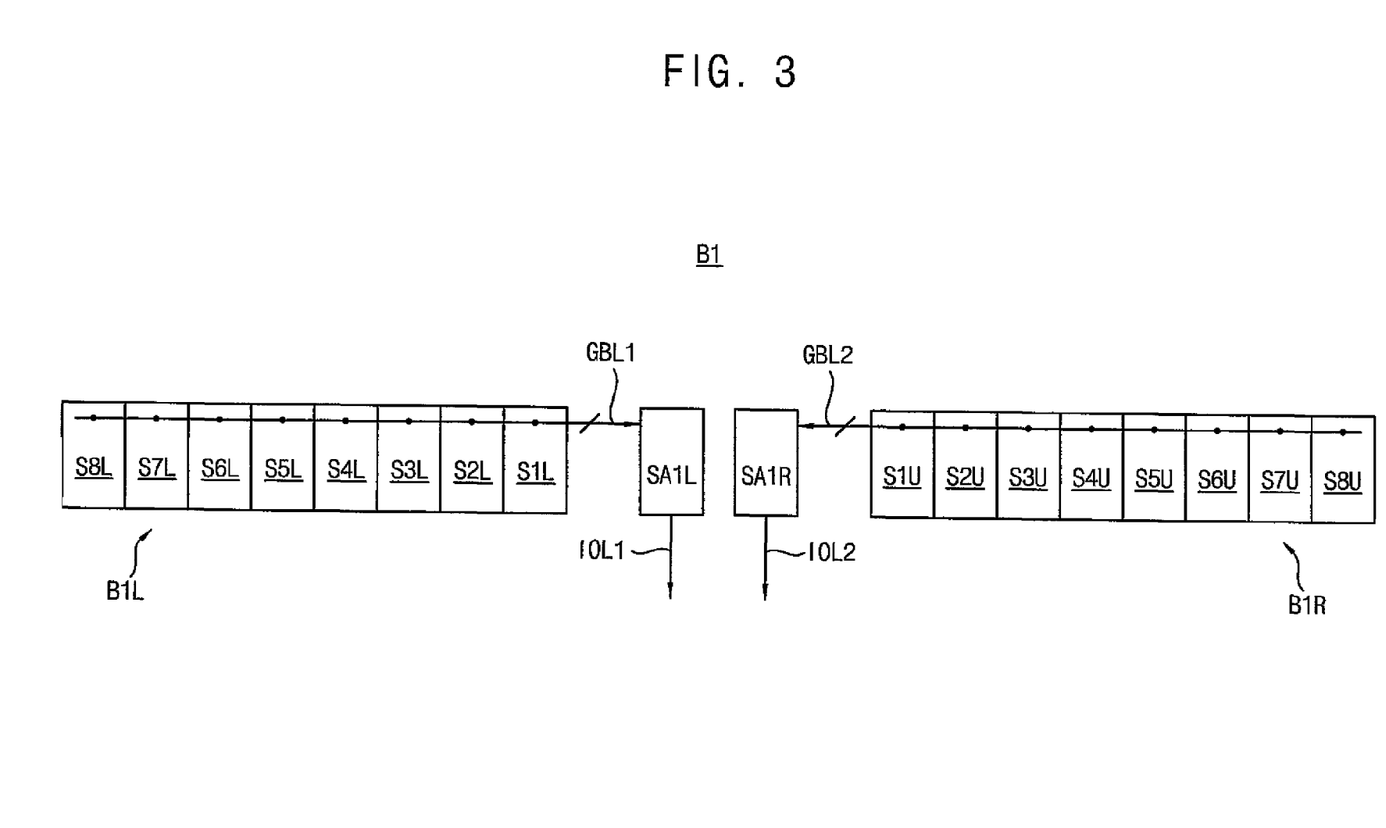
FIG. 3 is a block diagram illustrating physical sectors of a memory bank included in the memory cell array of FIG. 2, according to illustrative embodiments.

FIG. 3 is a block diagram illustrating physical sectors of a memory bank included in the memory cell array of FIG. 2, according to exemplary embodiments of the invention. In FIG. 3, write buffers included in the memory bank are not shown.

Referring to FIG. 3, a first memory bank B1 includes a first sub-memory bank B1L, a first sense amplifier SA1L, an eighth sub-memory bank B1R and an eighth sense amplifier SA1R, for example. The first sub-memory bank B1L includes first through eighth lower part physical sectors S1L, S2L, S3L, S4L, S5L, S6L, S7L and S8L, and the eighth sub-memory bank B1R includes first through eighth upper part physical sectors S1U, S2U, S3U, S4U, S5U, S6U, S7U and S8U.

The first through eighth lower part physical sectors S1L, S2L, S3L, S4L, S5L, S6L, S7L and S8L are coupled to the first sense amplifier SA1L through a first global bit line GBL1. An output signal of the first sense amplifier SA1L is output through a first input/output line IOL1. The first through eighth upper part physical sectors S1U, S2U, S3U, S4U, S5U, S6U, S7U and S8U are coupled to the eighth sense amplifier SA1R through a second global bit line GBL2. An output signal of the eighth sense amplifier SA1R is output through a second input/output line IOL2.

Figure 4:
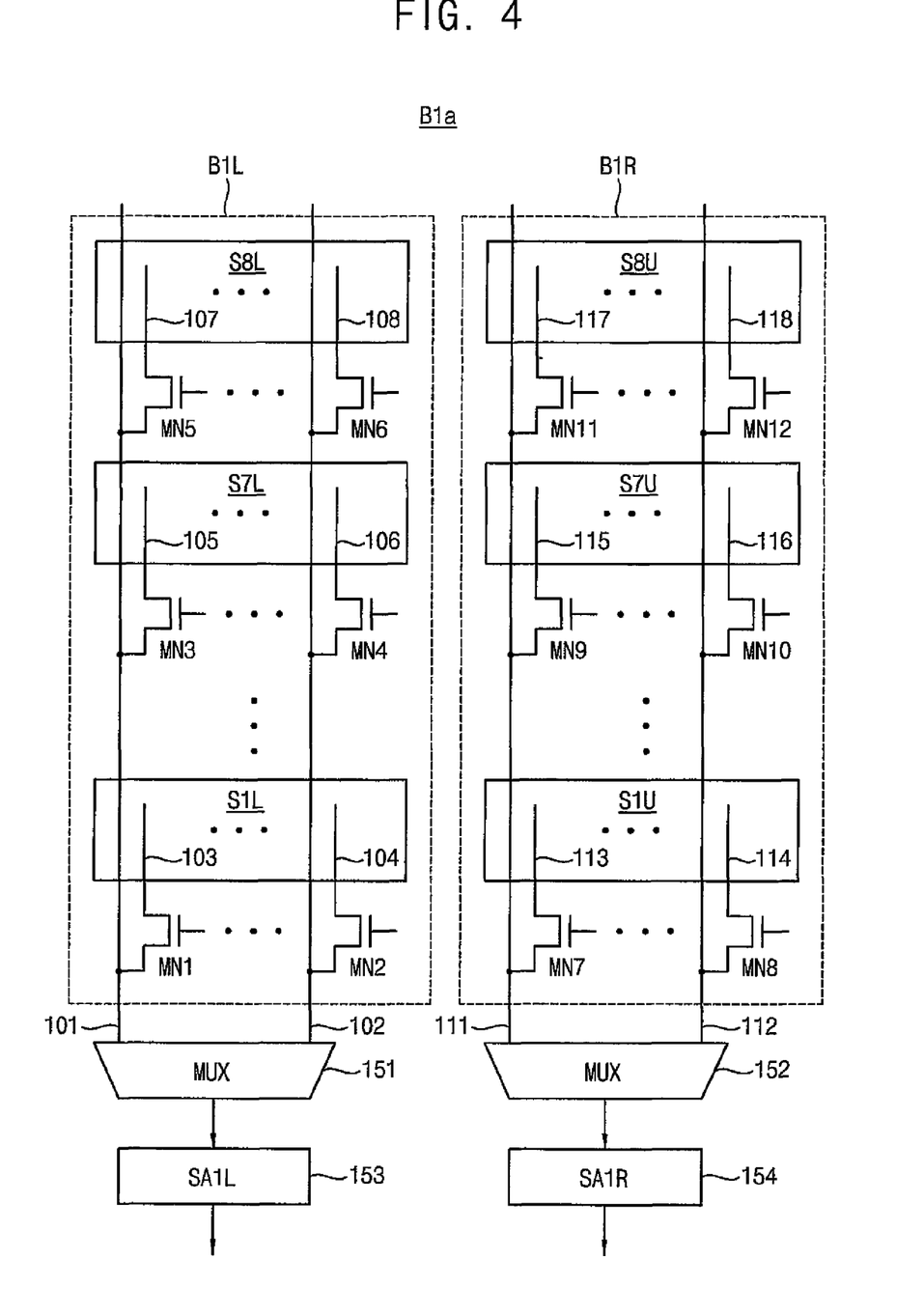
FIG. 4 is a circuit diagram illustrating the memory bank of FIG. 3, according to illustrative embodiments.

FIG. 4 is a circuit diagram illustrating the memory bank of FIG. 3, according to exemplary embodiments of the invention. In FIGS. 3 and 4, write buffers included in the memory bank are not shown.

Referring to FIG. 4, a first memory bank B1a includes a first sub-memory bank B1L, a first multiplexer 151, a first sense amplifier 153, an eighth sub-memory bank B1R, a second multiplexer 152 and an eighth sense amplifier 154. An output signal of the first multiplexer 151 is amplified by the first sense amplifier 153, and an output signal of the second multiplexer 152 is amplified by the second sense amplifier 154.

The first sub-memory bank B1L includes first through eighth lower part physical sectors S1L, S2L, S3L, S4L, S5L, S6L, S7L and S8L. A first local bit line 103 located in the first lower part physical sector S1L is coupled to a first global bit line 101 through a first NMOS transistor MN1, and a second local bit line 104 located in the first lower part physical sector S1L is coupled to a second global bit line 102 through a second NMOS transistor MN2. A third local bit line 105 located in the seventh lower part physical sector S7L is coupled to the first global bit line 101 through a third NMOS transistor MN3, and a fourth local bit line 106 located in the seventh lower part physical sector S7L is coupled to the second global bit line 102 through a fourth NMOS transistor MN4. A fifth local bit line 107 located in the eighth lower part physical sector S8L is coupled to the first global bit line 101 through a fifth NMOS transistor MN5, and a sixth local bit line 108 located in the eighth lower part physical sector S8L is coupled to the second global bit line 102 through a sixth NMOS transistor MN6.

The eighth sub-memory bank B1R includes first through eighth upper part physical sectors S1U, S2U, S3U, S4U, S5U, S6U, S7U and S8U. A seventh local bit line 113 located in the first upper part physical sector S1U is coupled to a third global bit line 111 through a seventh NMOS transistor MN7, and an eighth local bit line 114 located in the first upper part physical sector S1U is coupled to a fourth global bit line 112 through an eighth NMOS transistor MN8. A ninth local bit line 115 located in the seventh upper part physical sector S7U is coupled to the third global bit line 111 through a ninth NMOS transistor MN9, and a tenth local bit line 116 located in the seventh upper part physical sector S7U is coupled to the fourth global bit line 112 through a tenth NMOS transistor MN10. An eleventh local bit line 117 located in the eighth upper part physical sector S8U is coupled to the third global bit line 111 through a eleventh NMOS transistor MN11, and a twelfth local bit line 118 located in the eighth upper part physical sector S8U is coupled to the fourth global bit line 112 through a twelfth NMOS transistor MN12.

Hereinafter, operations of the first memory bank B1a will be described with reference to FIG. 4.

Each of the local bit lines 103, 104, 105, 106, 107, 108, 113, 114, 115, 116, 117 and 118 is coupled to memory cells. The first through sixth NMOS transistors MN1, MN2, MN3, MN4, MN5 and MN6 included in the first sub-memory bank B1L electrically couple the first through sixth local bit lines 103, 104, 105, 106, 107, 108 to the first and second global bit lines 101 and 102 in response to select signals applied to gates thereof. Similarly, the seventh through twelfth NMOS transistors MN7, MN8, MN9, MN10, MN11 and MN12 included in the eighth sub-memory bank B1R electrically couple the seventh through twelfth local bit lines 113, 114, 115, 116, 117 and 118 to the third and fourth global bit lines 111 and 112 in response to select signals applied to gates thereof.

In FIG. 4, the first multiplexer 151 selects either data on the first global bit line 101 or data on the second global bit line 102, and outputs the selected data. The first sense amplifier 153 senses and amplifies an output signal of the first multiplexer 151. The second multiplexer 152 selects either data on the third global bit line 111 or data on the fourth global bit line 112, and outputs the selected data. The second sense amplifier 154 senses and amplifies an output signal of the second multiplexer 152.

While FIG. 4 illustrates an architecture in which the memory bank B1a includes the multiplexers 151 and 152, it is understood that in various embodiments, the memory bank B1a may be implemented without the multiplexers 151 and 152, for example, when the sense amplifiers 153 and 154 are designed to perform multiplexing functionality.

Figure 5:
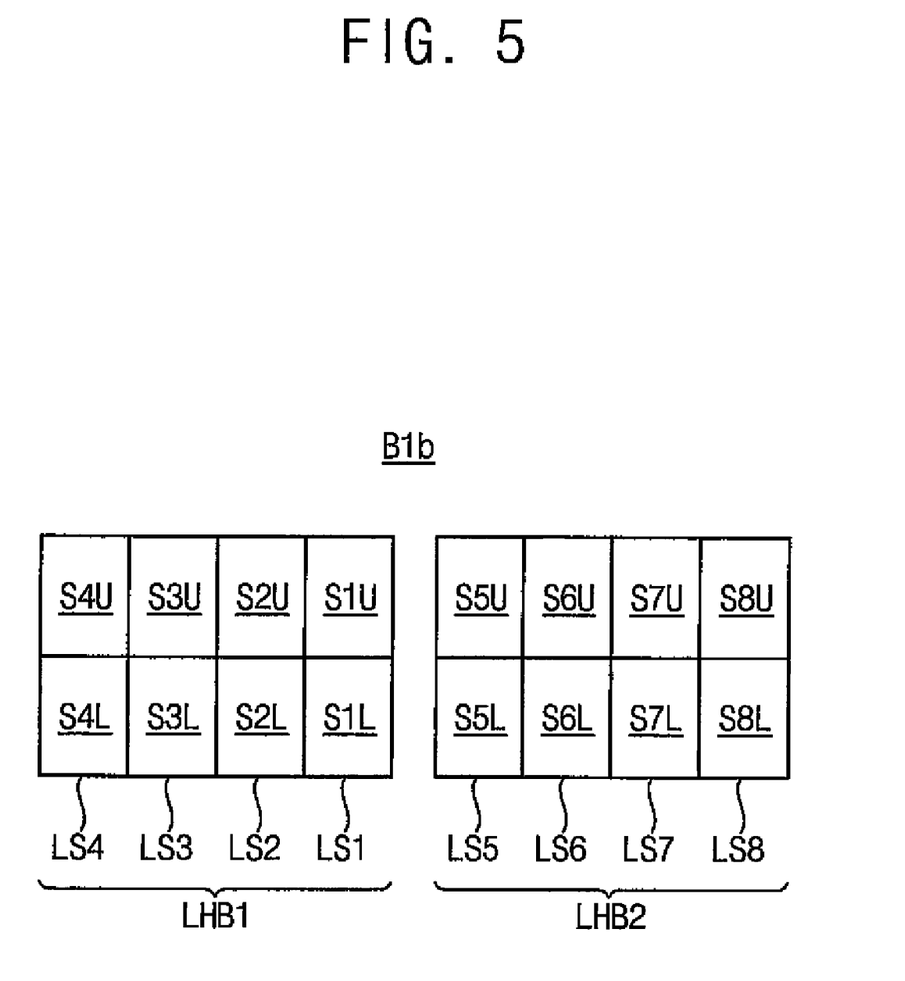
FIG. 5 is a block diagram illustrating logical sectors of the memory bank of FIG. 3, according to illustrative embodiments.

FIG. 5 is a block diagram illustrating logical sectors of the memory bank of FIG. 3, according to exemplary embodiments of the invention.

Referring to FIG. 5, a memory bank B1b includes a first logical half bank LHB1 and a second logical half bank LHB2. The first logical half bank LHB1 includes a first logical sector LS1, a second logical sector LS2, a third logical sector LS3 and a fourth logical sector LS4. The second logical half bank LHB2 includes a fifth logical sector LS5, a sixth logical sector LS6, a seventh logical sector LS7 and an eighth logical sector LS8.

The first logical sector LS1 includes a first lower part physical sector S1L included in the first sub-memory bank B1L illustrated in FIG. 3 and a first upper part physical sector S1U included in the eighth sub-memory bank B1R illustrated in FIG. 3. Similarly, the second logical sector LS2 includes a second lower part physical sector S2L and a second upper part physical sector S2U. The other logical sectors of the first logical half bank LHB1 and second logical half bank LHB2 are arranged in a similar fashion, such that, for example, the eighth logical sector LS8 includes an eighth lower part physical sector S8L and an eighth upper part physical sector S8U.

Figure 6:
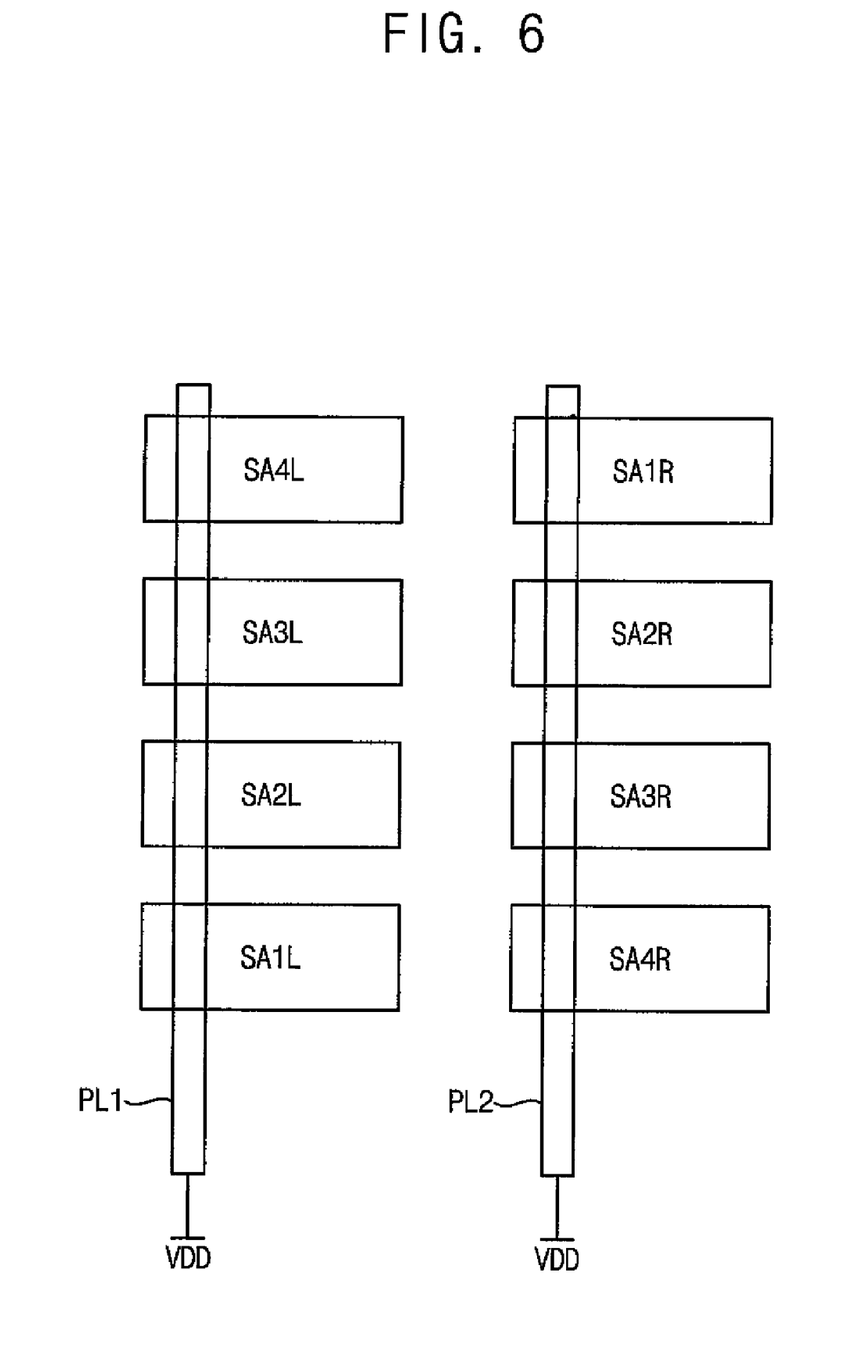
FIG. 6 is a block diagram illustrating an example of power lines that provide power supply voltages to sense amplifiers included in the memory cell array of FIG. 2.

FIG. 6 is a block diagram illustrating an example of power lines that provide power supply voltages to sense amplifiers included in the memory cell array of FIG. 2, according to exemplary embodiments of the invention.

Referring to FIG. 6, a first sense amplifier SA1L, a third sense amplifier SA2L, a fifth sense amplifier SA3L and a seventh sense amplifier SA4L are supplied with high power supply voltage VDD through a first power line PL1. A second sense amplifier SA4R, a fourth sense amplifier SA3R, a sixth sense amplifier SA2R and an eighth sense amplifier SA1R are supplied with the high power supply voltage VDD through a second power line PL2.

Figure 7:
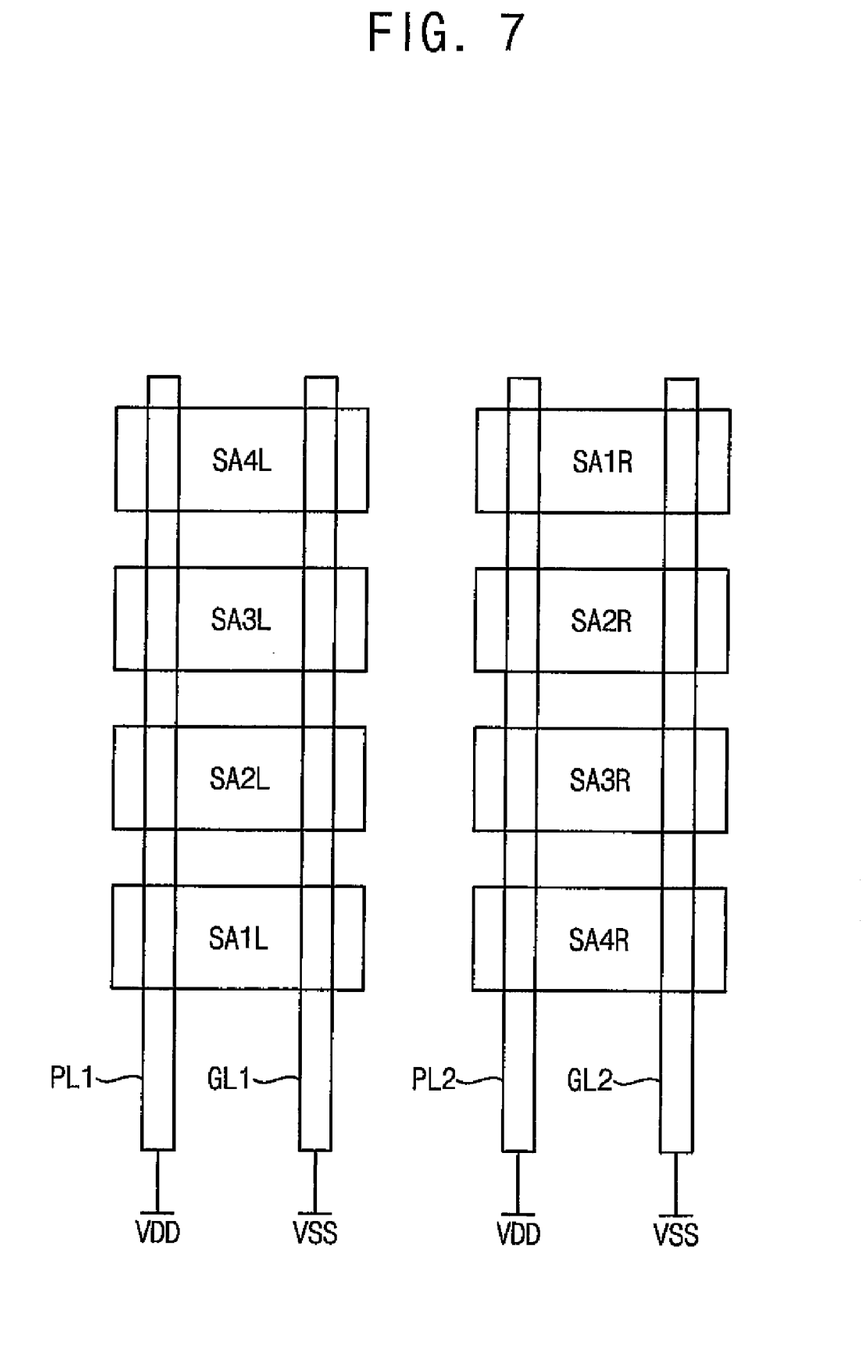
FIG. 7 is a block diagram illustrating another example of power lines that provide power supply voltages to sense amplifiers included in the memory cell array of FIG. 2.

FIG. 7 is a block diagram illustrating another example of power lines that provide power supply voltages to sense amplifiers included in the memory cell array of FIG. 2, according to exemplary embodiments of the invention.

Referring to FIG. 7, a first sense amplifier SA1L, a third sense amplifier SA2L, a fifth sense amplifier SA3L and a seventh sense amplifier SA4L are supplied with high power supply voltage VDD through a first power line PL1, and with low power supply voltage VSS through a first ground line GL1. A second sense amplifier SA4R, a fourth sense amplifier SA3R, a sixth sense amplifier SA2R and an eighth sense amplifier SA1R are supplied with the high power supply voltage VDD through a second power line PL2, and with the low power supply voltage VSS through a second ground line GL2.

Hereinafter, an architecture of a memory cell array 100 included in a flash memory device according to various exemplary embodiments of the present invention will be described with reference to FIGS. 2 through 7.

Referring to FIG. 2, the memory cell array 100 included in the flash memory device includes multiple row memory cell arrays 110, 120, 130 and 140. Each memory bank is comprised of sub-memory banks included in different row memory cell arrays. Each memory bank includes two sub-memory banks and two sense amplifiers that are dedicated to the two sub-memory banks, respectively.

For example, in the example illustrated in FIG. 2, a first memory bank includes a first sub-memory bank B1L, a first sense amplifier SA1L, an eighth sub-memory bank B1R and an eighth sense amplifier SA1R. The first sense amplifier SA1L is dedicated to the first sub-memory bank B1L, and the eighth sense amplifier SA1R is dedicated to the eighth sub-memory bank B1R.

Referring to FIG. 3, the first sub-memory bank B1L includes a first lower part physical sector S1L, a second lower part physical sector S2L, a third lower part physical sector S3L, a fourth lower part physical sector S4L, a fifth lower part physical sector S5L, a sixth lower part physical sector S6L, a seventh lower part physical sector S7L and an eighth lower part physical sector S8L. The eighth sub-memory bank B1R includes a first upper part physical sector S1U, a second upper part physical sector S2U, a third upper part physical sector S3U, a fourth upper part physical sector S4U, a fifth upper part physical sector S5U, a sixth upper part physical sector S6U, a seventh upper part physical sector S7U and an eighth upper part physical sector S8U.

In the conventional memory cell array as illustrated in FIG. 1, the physical sectors S1, S2, S3, S4, S5, S6, S7 and S8 included in the memory bank 10 are the same as the logical sectors, respectively. However, in the memory cell array 100, according to exemplary embodiments of the present invention, each of the sub-memory banks included in the memory bank is comprised of parts of the logical sectors.

Referring to FIG. 5, each of the logical sectors included in one memory bank includes an upper part physical sector and a lower part physical sector that are included in sub-memory banks in different rows, respectively. For example, a first logical sector LS1 includes a first lower part physical sector S1L and a first upper part physical sector S1U, a second logical sector LS2 includes a second lower part physical sector S2L and a second upper part physical sector S2U, a third logical sector LS3 includes a third lower part physical sector S3L and a third upper part physical sector S3U, and a fourth logical sector LS4 includes a fourth lower part physical sector S4L and a fourth upper part physical sector S4U. A fifth logical sector LS5 includes a fifth lower part physical sector S5L and a fifth upper part physical sector S5U, a sixth logical sector LS6 includes a sixth lower part physical sector S6L and a sixth upper part physical sector S6U, a seventh logical sector LS7 includes a seventh lower part physical sector S7L and a seventh upper part physical sector S7U, and an eighth logical sector LS8 includes an eighth lower part physical sector S8L and an eighth upper part physical sector S8U.

Referring to FIGS. 3 and 5, one logical sector includes two physical sectors. For example, one of the two physical sectors is included in the first sub-memory bank B1L, and the other is included in the eighth sub-memory bank B1R.

For example, the first lower part physical sector S1L of the first logical sector LS1 is included in the first sub-memory bank B1L, and the first upper part physical sector S1U of the first logical sector LS1 is included in the eighth sub-memory bank B1R. The second lower part physical sector S2L of the second logical sector LS2 is included in the first sub-memory bank B1L, and the second upper part physical sector S2U of the second logical sector LS2 is included in the eighth sub-memory bank B1R. The other physical and logical sectors are arranged in a similar fashion, such that, for example, the eighth lower part physical sector S8L of the eighth logical sector LS8 is included in the first sub-memory bank B1L, and the eighth upper part physical sector S8U of the eighth logical sector LS8 is included in the eighth sub-memory bank B1R.

In each memory bank included in the memory cell array, according to exemplary embodiments of the present invention, when a number of physical sectors is K (where K is a natural number) and a number of logical sectors is L (where L is a natural number), the number of sub-memory banks M is represented by M=K/L.

In a typical flash memory device, program operations, i.e., write operations, are performed by memory bank units, and erase operations are performed by sector units. The memory bank B1 illustrated in FIG. 3 includes the first sub-memory bank B1L comprised of lower part logical sectors, the eighth sub-memory bank B1R comprised of upper part logical sectors, the first sense amplifier SA1L coupled to the first sub-memory bank B1L and the eighth sense amplifier SA1R coupled to the eighth sub-memory bank B1R. The first sense amplifier SA1L amplifies data output from each sector of the first sub-memory bank B1L, and outputs the amplified data through the first input/output line IOL1. The eighth sense amplifier SA1R amplifies data output from each sector of the eighth sub-memory bank B1R, and outputs the amplified data through the second input/output line IOL2.

In a typical non-volatile memory device, erase operations and read operations are performed by logical sector units. In the memory cell array according to exemplary embodiments of the present invention, physical sectors constituting the same logical sector included in different sub-memory banks are substantially simultaneously accessed when a read operation is performed.

As illustrated in FIG. 3, a size of each physical sector included in the sub-memory banks B1L and B1R is substantially half that of each logical sector. That is, a circuit size of each of the lower part physical sectors S1L, S2L, S3L, S4L, S5L, S6L, S7L and S8L and the upper part physical sectors S1U, S2U, S3U, S4U, S5U, S6U, S7U and S8U included in the memory bank B1 of FIG. 3 is half of a circuit size of each physical sector included in the conventional memory bank illustrated in FIG. 1. For example, a size of the physical sector S1 in the memory bank 10 illustrated in FIG. 1 is the same as the sum of sizes of the first lower part physical sector S1L and first the upper part physical sector S1U in the memory bank B1 illustrated in FIG. 3.

Referring to FIG. 3, the first sub-memory bank B1L includes the lower part physical sectors S1L, S2L, S3L, S4L, S5L, S6L, S7L and S8L, and the eighth sub-memory bank B1R includes the upper part physical sectors S1U, S2U, S3U, S4U, S5U, S6U, S7U and S8U.

As illustrated in FIG. 2, each memory bank includes sub-memory banks in different row memory cell arrays, respectively, thereby improving efficiencies of write buffers WB1, WB2, WB3 and WB4 included in the memory cell array 100 of FIG. 2. In the illustrated embodiment in FIG. 2, the first memory bank B1 includes the sub-memory bank B1L included in the first row memory array 110, the first sense amplifier SA1L included in the first row memory array 110, the eighth sub-memory bank B1R included in the fourth row memory array 140 and the eighth sense amplifier SA1R included in the fourth row memory array 140.

For example, when data are written to the first memory bank B1, data to be written to the first sub-memory bank B1L included in the first memory bank B1 are buffered by the first write buffer WB1, and data to be written to the eighth sub-memory bank B1R included in the first memory bank B 1 are buffered by the fourth write buffer WB4. In a conventional flash memory device, where a memory bank includes first and second sub-memory banks and sense amplifiers in the same row memory cell array, data related to both sub-memory banks are buffered by the same write buffer. However, the memory cell array 100, according to exemplary embodiments of the present invention illustrated in FIG. 2, may efficiently utilize write buffers as compared with the conventional memory cell array including memory banks comprised of sub-memory banks in the same row.

In FIG. 6, the first sense amplifier SA1L, the third sense amplifier SA2L, the fifth sense amplifier SA3L and the seventh sense amplifier SA4L sense and amplify data related to the first, third, fifth and seventh sub-memory banks B1L, B2L, B3L and B4L, respectively, located on one side of the memory cell array 100 of FIG. 2. The second sense amplifier SA4R, the fourth sense amplifier SA3R, the sixth sense amplifier SA2R and the eighth sense amplifier SA1R sense and amplify data related to the second, fourth, sixth and eighth sub-memory banks B4R, B3R, B2R and B1R, respectively, located on the other side of the memory cell array 100 of FIG. 2. The first, third, fifth and seventh sense amplifiers SA1L, SA2L, SA3L and SA4L are coupled to the first, third, fifth and seventh sub-memory banks B1L, B2L, B3L and B4L, respectively. The second, fourth, sixth and eighth sense amplifiers SA4R, SA3R, SA2R and SA1R are coupled to the second, fourth, sixth and eighth sub-memory banks B4R, B3R, B2R and B1R, respectively.

The first, third, fifth and seventh sense amplifiers SA1L, SA2L, SA3L and SA4L located on the one side of the memory cell array 100 are supplied with high power supply voltage VDD through a first power line PL1, and the second, fourth, sixth and eighth sense amplifiers SA4R, SA3R, SA2R and SA1R located on the other side of the memory cell array 100 are supplied with the high power supply voltage VDD through a second power line PL2.

As described above, the sense amplifiers SA1L, SA2L, SA3L and SA4L located on the one side and the sense amplifiers SA4R, SA3R, SA2R and SA1R located on the other side the memory cell array 100 are supplied with the high power supply voltage VDD through different power lines, thereby dispersing peak power noise.

In FIG. 7, the sense amplifiers SA1L, SA2L, SA3L and SA4L located on one side of the memory cell array 100 are supplied with high power supply voltage VDD through a first power line PL1 and with low power supply voltage VSS through a first ground line GL1. The sense amplifiers SA4R, SA3R, SA2R and SA1R located on the other side of the memory cell array 100 are supplied with the high power supply voltage VDD through a second power line PL2 and with the low power supply voltage VSS through a second ground line GL2.

As described above, the sense amplifiers SA1L, SA2L, SA3L and SA4L located on the one side and the sense amplifiers SA4R, SA3R, SA2R and SA1R located on the other side of the memory cell array 100 are supplied with the high power supply voltage VDD and/or the low power supply voltage VSS through different power lines and/or different ground lines, thereby dispersing peak power noise.

Referring to FIGS. 2 through 7, the memory cell array, according to various exemplary embodiments of the present invention, may be provided by the following method:

1) dividing each logical sector of a memory bank into two or more physical sectors;

2) constituting a sub-memory bank based on physical sectors which are selected from different logical sectors;

3) constituting the memory bank based on a combination of sub-memory banks in different rows; and 4) assigning dedicated sense amplifiers to the sub-memory banks, respectively.

In a method of providing a memory cell array according to various embodiments, the logical sector may be the unit of an erase operation or a read operation in a non-volatile semiconductor memory device. Also, physical sectors constituting one logical sector included in different sub-memory banks may be substantially simultaneously accessed when a read operation is performed. In addition, the physical sectors may be supplied with power through different power lines.

Figure 8:
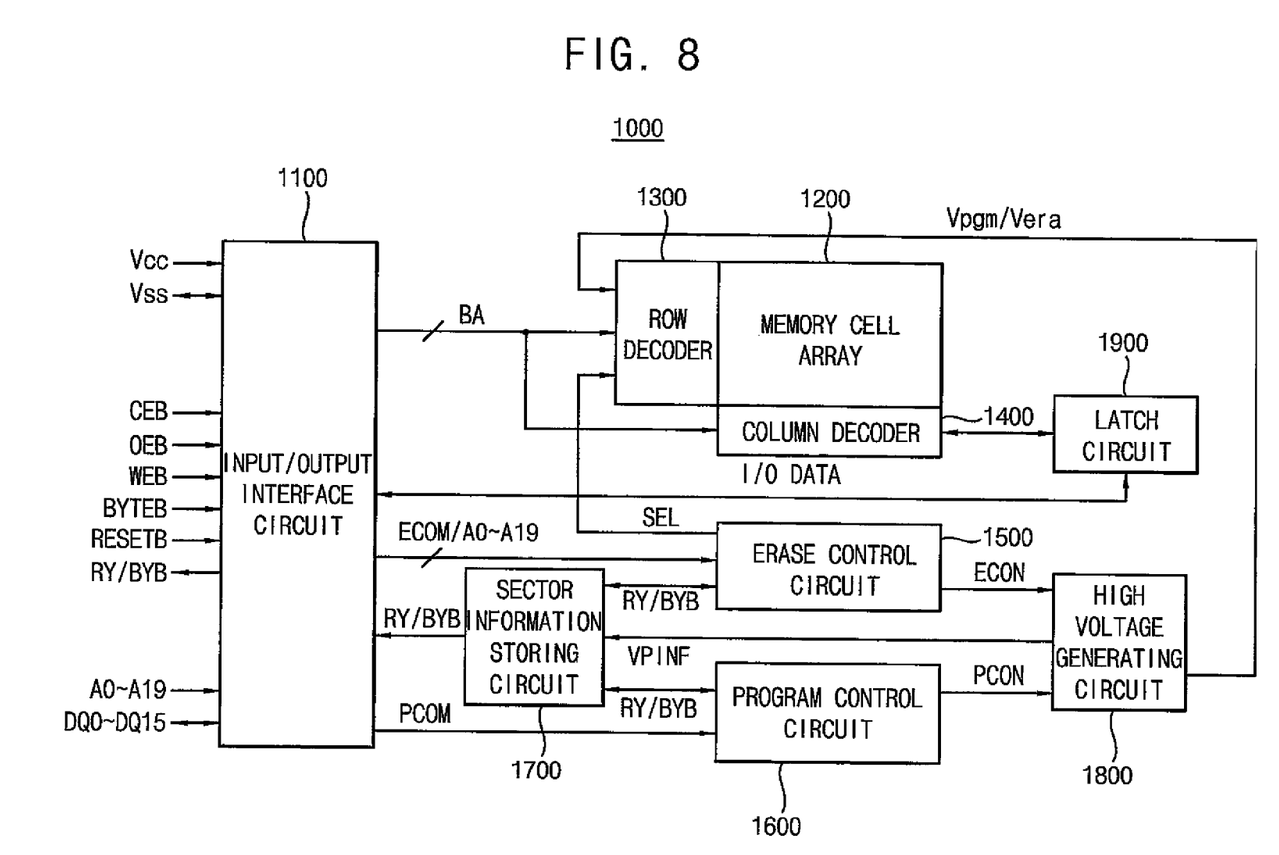
FIG. 8 is a block diagram illustrating a flash memory device including the memory cell array of FIG. 2, according to illustrative embodiments.

FIG. 8 is a block diagram illustrating a flash memory device, including the memory cell array of FIG. 2, according to exemplary embodiments of the present invention.

Referring to FIG. 8, the flash memory device 1000 includes an input/output interface circuit 1100, a memory cell array 1200, a row decoder 1300, a column decoder 1400, an erase control circuit 1500, a program control circuit 1600, a sector information storing circuit 1700, a high voltage generating circuit 1800 and a latch circuit 1900.

The input/output interface circuit 1100 receives control signals CEB, OEB, WEB, BYTEB, RESETB, RY and BYB, data DQ0 through DQ15 and addresses A0 through A19, and generates a bank address BA for selecting a memory bank of the memory cell array 1200, a program command PCOM and/or an erase command ECOM. The memory cell array 1200 may have a configuration illustrated in FIG. 2, for example. The memory cell array 1200 may include multiple memory banks.

Each memory bank includes multiple sectors, each of which has multiple memory cells. The row decoder 1300 generates a word line drive signal by decoding the bank address BA in response to a program voltage Vpgm or an erase voltage Vera. The column decoder 1400 generates a column select signal by decoding the bank address BA. The word line drive signal and the column select signal are applied to the memory cell array 1200. The erase control circuit 1500 generates an erase control signal ECON and a select signal SEL based on the erase command ECOM, a busy signal BYB and a ready signal RY. The program control circuit 1600 generates a program control signal PCON based on the program command PCOM, the busy signal BYB and the ready signal RY.

The sector information storing circuit 1700 stores information on sectors of the memory cell array 1200. The high voltage generating circuit 1800 generates the program voltage Vpgm or the erase Voltage Vera based on the program control signal PCON and the erase control signal ECON when the program operation or the erase operation is performed. The latch circuit 1900 provides data I/O DATA received from the input/output interface circuit 1100 to the memory cell array 1200 through the column decoder 1400 during the program operation. Also, when the read operation is performed, the latch circuit 1900 receives data I/O DATA from the memory cell array 1200 through the column decoder 1400, and provides the received data to the input/output interface circuit 1100.

In the flash memory device 1000 of FIG. 8, the memory cell array 1200 may have a memory bank architecture, as illustrated in FIG. 3, for example. The memory cell array 1200 includes multiple memory banks, each of which includes multiple logical sectors, and each logical sector includes multiple physical sectors, or parts of the logical sectors. The memory bank includes sub-memory banks in different rows. The memory cell array 1200 also includes multiple sense amplifiers dedicated to the sub-memory banks, respectively.

As mentioned above, in the memory cell array according to various embodiments of the present invention, a logical sector is divided into multiple physical sectors, and the physical sectors constituting one logical sector are included in different sub-memory banks. The memory cell array according to various embodiments of the present invention includes independent sense amplifiers according to sub-memory banks. Therefore, the memory cell array according to various embodiments of the present invention may reduce power noise and have improved coupling characteristics, for example, as well as efficiently utilize write buffers. The memory cell array may be applicable to a non-volatile memory, such as a flash memory, for example.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A memory cell array comprising a plurality of row memory cell arrays, the memory cell array comprising:
    a plurality of memory banks, each of the plurality of memory banks comprising a plurality of logical sectors and at least two sub-memory banks of a plurality of sub-memory banks, the at least two sub-memory banks being included in different row memory cell arrays of the plurality of row memory cell arrays, and each of the plurality of sub-memory banks comprising a plurality of physical sectors; and
    a plurality of sense amplifiers dedicated to the plurality of sub-memory banks, respectively.

2. The memory cell array of claim 1, further comprising a plurality of write buffers corresponding to the plurality of memory banks, wherein data to be written to each of the plurality of memory banks are buffered by the corresponding write buffer.

3. The memory cell array of claim 1, wherein each of the plurality of logical sectors is a unit of an erase operation or a read operation.

4. The memory cell array of claim 1, wherein a number of the at least two sub-memory banks included in each of the plurality of memory banks is a quotient obtained by dividing a number of the plurality of physical sectors included in the each of the plurality of memory banks by a number of logical sectors included in the each of the plurality of memory banks.

5. The memory cell array of claim 1, wherein at least two physical sectors respectively included in the at least two sub-memory banks are substantially simultaneously accessed during a read operation.

6. The memory cell array of claim 5, wherein the at least two physical sectors substantially simultaneously accessed are included in the same logical sector of the plurality of logical sectors.

7. The memory cell array of claim 1, further comprising:
    power lines configured to provide a power supply voltage to the plurality of sub-memory banks, the power lines being physically separated from each other.

8. The memory cell array of claim 1, further comprising:
    first power lines configured to provide a high power supply voltage to the plurality of sub-memory banks, the first power first lines being physically separated from each other; and
    second power lines configured to provide a low power supply voltage to the plurality of sub-memory banks, the second power lines being physically separated from each other.

9. The memory cell array of claim 1, wherein each of the plurality of logical sectors includes two physical sectors of the plurality of physical sectors.

10. The memory cell array of claim 9, wherein each of the plurality of memory banks includes two sub-memory banks.

11. The memory cell array of claim 9, wherein each of the plurality of memory banks further comprises:
    a first sub-memory bank of the plurality of sub-memory banks, the first sub-memory bank comprising lower part physical sectors, each of the lower part physical sectors being one of the two physical sectors of each logical sector;
    a first sense amplifier of the plurality of sense amplifiers, the first sense amplifier configured to amplify an output signal of the first sub-memory bank and to output the amplified output signal through a first input/output line;
    a second sub-memory bank of the plurality of sub-memory banks, the second sub-memory bank comprising upper part physical sectors, each of the upper part physical sectors being the other of the two physical sectors of each logical sector; and
    a second sense amplifier of the plurality of sense amplifiers, the second sense amplifier configured to amplify an output signal of the second sub-memory bank and to output the amplified output signal through a second input/output line.

12. The memory cell array of claim 11, wherein a first lower part physical sector of the lower part physical sectors included in the first sub-memory bank and a first upper part physical sector of the upper part physical sectors included in the second sub-memory bank are substantially simultaneously accessed during a read operation.

13. The memory cell array of claim 11, further comprising:
    a first power line configured to provide a power supply voltage to the lower part physical sectors included in the first sub-memory bank; and
    a second power line configured to provide the power supply voltage to the upper part physical sectors included in the second sub-memory bank, the second power line being physically separated from the first power line.

14. The memory cell array of claim 11, further comprising:
    a first power line configured to provide a high power supply voltage to the lower part physical sectors included in the first sub-memory bank;
    a second power line configured to provide the high power supply voltage to the upper part physical sectors included in the second sub-memory bank, the second power line being physically separated from the first power line;
    a third power line configured to provide a low power supply voltage to the lower part physical sectors included in the first sub-memory bank; and
    a fourth power line configured to provide the low power supply voltage to the upper part physical sectors included in the second sub-memory bank, the fourth power line being physically separated from the third power line.

15. A non-volatile memory device, comprising:
    a voltage generator configured to generate a program voltage or an erase voltage based on a program control signal or an erase control signal, respectively;
    a row decoder configured to generate a word line drive signal based on a bank address and at least one of the program voltage and the erase voltage;
    a column decoder configured to generate a column select signal by decoding the bank address; and
    a memory cell array configured to operate in response to the word line drive signal and the column select signal, the memory cell array divided into a plurality of row memory cell arrays, the memory cell array comprising:
        a plurality of memory banks, each of the plurality of memory banks comprising a plurality of logical sectors and at least two sub-memory banks of a plurality of sub-memory banks, the at least two sub-memory banks being included in different row memory cell arrays of the plurality of row memory cell arrays, and each of the plurality of sub-memory banks comprising a plurality of physical sectors; and
        a plurality of sense amplifiers dedicated to the plurality of sub-memory banks, respectively.

16. The non-volatile memory device of claim 15, wherein data to be written to each memory bank are buffered by different write buffers of a plurality of write buffers.

17. The non-volatile memory device of claim 15, wherein at least two physical sectors respectively included in the at least two sub-memory banks are substantially simultaneously accessed during a read operation.

18. The non-volatile memory device of claim 17, wherein the at least two physical sectors substantially simultaneously accessed are included in the same logical sector of the plurality of logical sectors.

19. The non-volatile memory device of claim 15, wherein the memory cell array further comprises:

power lines configured to provide a power supply voltage to the plurality of sub-memory banks, the power lines being physically separated from each other.

20. The non-volatile memory device of claim 15, wherein each of the plurality of logical sectors includes two physical sectors of the plurality of physical sectors.

\* \* \* \* \*